United States Patent [19]

Seino

[11] Patent Number: 5,683,933
[45] Date of Patent: Nov. 4, 1997

[54] METHOD OF FABRICATING A SEMICONDUCTOR DEVICE

[75] Inventor: Tatsuya Seino, Tochigi-ken, Japan

[73] Assignee: Nippon Precision Circuits Inc., Tokyo, Japan

[21] Appl. No.: 663,426

[22] Filed: Jun. 17, 1996

[30] Foreign Application Priority Data

Jun. 19, 1995 [JP] Japan .................. 7-151741

[51] Int. Cl.$^6$ ............................................. H01L 21/76
[52] U.S. Cl. ............................ 437/70; 437/89; 437/69
[58] Field of Search ........................... 437/69, 70, 72, 437/73, 89

[56] References Cited

U.S. PATENT DOCUMENTS

| | | | |
|---|---|---|---|
| 4,818,235 | 4/1989 | Chao | 437/69 |
| 5,087,586 | 2/1992 | Chan et al. | 437/72 |
| 5,130,268 | 7/1992 | Liou et al. | 437/72 |
| 5,215,935 | 6/1993 | Nagao | 437/69 |
| 5,447,885 | 9/1995 | Cho et al. | 437/69 |

FOREIGN PATENT DOCUMENTS

| | | |
|---|---|---|
| 0012942 | 1/1990 | Japan . |
| 0067728 | 3/1990 | Japan . |

OTHER PUBLICATIONS

Sung et al., "the Impact of Poly-Removal Techniques on Thin Thermal Oxide Property in Poly-Buffer LDCOS Technology", IEEE Transaction on Electron Devices, vol. 38, No. 8, Aug. 1991, pp. 1970-1973.

Primary Examiner—Trung Dang
Attorney, Agent, or Firm—Jordan and Hamburg

[57] ABSTRACT

To minimize error in size and form a thick oxide layer as field insulating means in a narrow isolation region, a method of fabricating a semiconductor device is carried out as followings.

A polysilicon layer 3 is formed on a silicon substrate 1. A silicon nitride layer 5 is then formed on the polysilicon layer 3. Thereafter, an aperture 7 is formed in the silicon nitride layer 5 and reaches the polysilicon layer. A silicon layer 9 is formed in the aperture 7 by epitaxial growth technique. The silicon layer 9 is selectively oxidized to form an oxide layer 10 as field insulating means. The silicon nitride layer 5 and a portion of the polysilicon layer 3 which was left unoxidized are removed. This makes it possible to form the desired thick oxide layer as field insulating means in a narrow region.

4 Claims, 1 Drawing Sheet

METHOD OF FABRICATING A SEMICONDUCTOR DEVICE

BACKGROUND

The present invention relates to a method of fabricating a semiconductor device.

A conventional method, such as LOCOS technique, of insulating semiconductor elements formed on a silicon substrate typically includes the steps of forming a patterned layer of silicon nitride ($Si_3N_4$) on the silicon substrate through an insulating layer and then, effecting selective oxidization, with the silicon nitride layer serving as a mask, so as to form a thick oxide layer as field insulating means for insulating semiconductor element.

Such a conventional method or LOCOS technique however suffers from error in size as the oxide layer penetrates under the silicon nitride layer (commonly referred to as "bird's-beak encroachment"). Also, the thick oxide layer as field insulating means is hardly formed in a narrow region.

It is, therefore, an object of the present invention to provide a method of fabricating a semiconductor device which minimizes error in size and allows a thick oxide layer as field insulating means to be formed in a narrow region.

SUMMARY

The foregoing object is achieved by providing a method of fabricating a semiconductor device which includes the steps of forming a first silicon layer on the top of a silicon substrate, forming a silicon nitride layer on the top of the first silicon layer, removing a selected portion of the silicon nitride layer so as to form an aperture which reaches the first silicon layer, forming a second silicon layer on an exposed portion of the first silicon layer so as to close the aperture, selectively oxidizing the second silicon layer and a portion of the first silicon layer which corresponds to the second silicon layer to form an oxide layer as field insulating means while the silicon nitride layer serves as a mask, and removing the silicon nitride layer and the first silicon layer while the oxide layer as field insulating means is left on the silicon substrate.

Preferably, this semiconductor device fabrication method further includes the steps of implanting an impurity ion into a portion of the silicon substrate located below the aperture after the aperture defining step, and activating the impurity ion so as to form a layer for preventing inversion during the isolation oxide layer forming step.

The foregoing object is also achieved by providing a method of fabricating a semiconductor device which includes the steps of forming a first silicon layer on the top of a silicon substrate, forming a silicon nitride layer on the top of the first silicon layer, removing a selected portion of the silicon nitride layer so as to form an aperture which reaches the first silicon layer, forming a second silicon layer on an exposed portion of the first silicon layer so as to close the aperture, selectively oxidizing the second silicon layer and a portion of the first silicon layer which corresponds to the second silicon layer to form a first oxide layer as field insulating means while the silicon nitride layer serves as a mask, and removing the silicon nitride layer, subjecting a portion of the first silicon layer which is left unoxidized to oxygen so as to form a second oxide layer, and removing the second oxide layer while the first oxide layer as field insulating means is left on the silicon substrate.

Preferably, this semiconductor device fabrication method further includes the steps of implanting an impurity ion into a portion of the silicon substrate located below the aperture after the aperture forming step, and activating the impurity ion so as to form a layer for preventing inversion during the first isolation oxide layer forming step.

DETAILED DESCRIPTION OF THE INVENTION

Reference will now be made to a method of fabricating a semiconductor device according to one embodiment of the present invention. FIGS. 1A to 1G illustrate fabrication process sequence. The present invention will now be described with reference to FIGS. 1A to 1G.

Figure 1A:
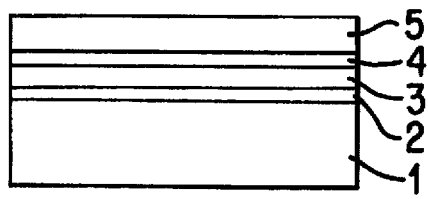
FIGS. 1A to 1G illustrate a method of fabricating a semiconductor device according to one embodiment of the present invention.

Referring first to FIG. 1A, a silicon substrate 1 is heated in an oxygen ambient at a temperature of 1,000° C. to thermally grow an oxide layer 2 (of a thickness of approximately 50 nm). A polysilicon layer 3 (of a thickness of approximately 100 nm) is then deposited on the oxide layer 2 by chemical vapour deposition. The polysilicon layer 3 is also heated in an oxygen ambient at a temperature of 1,000° C. to thermally grow an oxide layer 4 (of a thickness of approximately 50 nm). A layer of silicon nitride 5 (of a thickness of approximately 130 nm) is thereafter formed on the oxide layer 4 by chemical vapour deposition.

Figure 1B:
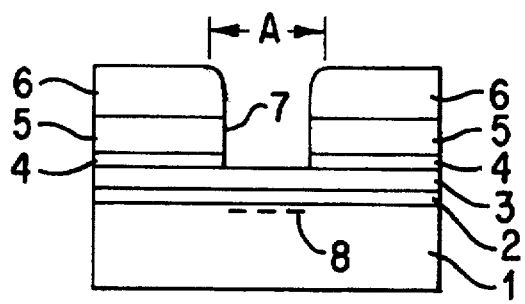

Referring to FIG. 1B, a layer of photoresist material 6 serves as a mask. Fluorine gas is used to anisotropically etch or remove a part of the silicon nitride layer 5 where a field insulating region A is formed. Fluoric acid is then used to form an aperture 7. In order to prevent inversion, an impurity ion, such as $B^+$, of approximately $5 \times 10^{13}$ $cm^{-2}$ is implanted, with an accelerating voltage of 100 KeV, into a portion of the silicon substrate 1 where the isolation region A is formed.

Figure 1C:
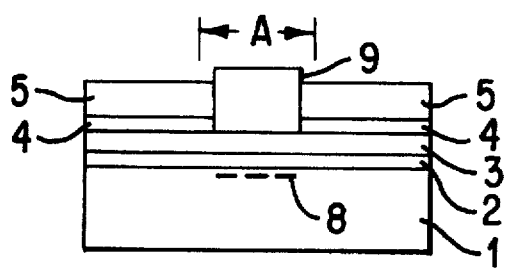

Referring now to FIG. 1C, the photoresist layer 6 is removed. A polycrystalline (or single crystal) silicon layer 9 (of a thickness of approximately 300 nm) is formed or epitaxially grown on a portion of the polysilicon layer 3 which is exposed to the aperture 7. The aperture 7 is thus closed by the silicon layer 9. The silicon layer 9 is thereafter subject to oxygen and turned to an oxide layer as field insulating means. The thickness of this oxide layer is readily adjustable by controlling the growth of the silicon layer 9.

Figure 1D:
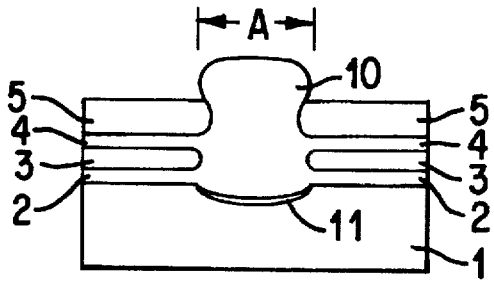

Referring next to FIG. 1D, while the silicon nitride layer 5 serves as a mask, the silicon layer 9 is heated in a wet oxygen ambient at a temperature of 1,000° C. so as to selectively oxidize the silicon layer 9. This results in the formation of an oxide layer 10 as field insulating means of a thickness of approximately 700 nm. The oxide layer 10 as field insulating means is fit in a given narrow region or the predetermined field insulating region A. During the wet oxidizing step, the impurity ion 8 implanted into the silicon substrate 1 is again diffused and activated to form a layer 11 for preventing inversion of the surface.

Figure 1E:
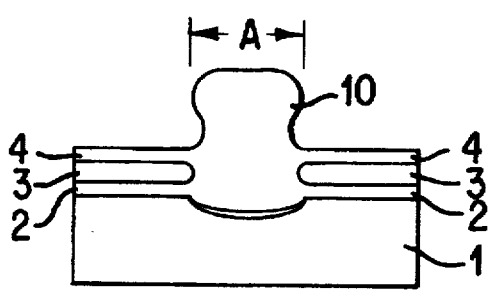

As shown in FIG. 1E, the silicon nitride layer 5 is removed by the use of phosphoric acid.

Figure 1F:
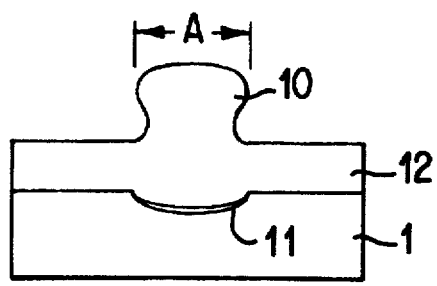

As shown in FIG. 1F, a portion of the polysilicon layer 3 which was left unoxidized during the previous wet oxidizing step is subject to heat at a temperature of 1,000° C. and oxygen to thermally grow an oxide layer 12.

Figure 1G:
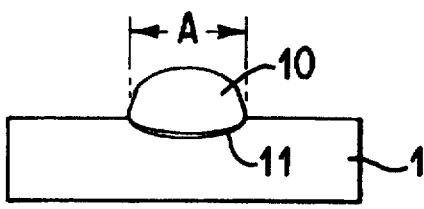

Referring finally to FIG. 1G, the oxide layers 10 as field insulating means and the oxide layer 12 are both etched by the use of NH4F solution. The silicon substrate 1 is exposed when the oxide layer 12 is completely removed. The oxide layer 10 as field insulating means is etched to an extent corresponding to the thickness of the oxide layer 12. The oxide layer 10 as field insulating means is then left in the field insulating region A.

With this embodiment, the silicon nitride layer 5 serves as a mask to allow for local oxidization of the silicon layer 9. This brings about a reduction in error in size when the oxide layer 10 as field insulating means is formed. The silicon substrate 1 per se is less oxidized in this embodiment than in the LOCOS technique. This also reduces crystal defects within the silicon substrate 1.

According to the present invention, it is possible to form the desired oxide layer as field insulating means in a narrow region by forming a silicon nitride layer on a first silicon layer on a silicon substrate, forming an aperture in the silicon nitride layer which reaches the first silicon layer, forming a second silicon layer in the aperture, and selectively oxidizing the second silicon layer and the first silicon layer to form an oxide layer as field insulating means.

What is claimed is:

1. A method of fabricating a semiconductor device which comprises the steps of:

forming a first oxide layer on a top surface of a silicon substrate;

forming a first polysilicon layer on a top surface of said first oxide layer;

forming a second oxide layer on a top surface of said first polysilicon layer;

forming a silicon nitride layer on a top surface of the second oxide layer;

removing a selected portion of the silicon nitride layer and said second oxide layer so as to form an aperture, said aperture reaching said first polysilicon layer;

forming one of a silicon layer and a second polysilicon layer on an exposed portion of the first polysilicon layer so as to close the aperture;

selectively oxidizing said one of a silicon layer and a second polysilicon layer and a portion of the first polysilicon layer defined beneath said one of a silicon layer and a second polysilicon layer to form an oxide layer as a field insulating means while said silicon nitride layer serves as a mask; and removing the silicon nitride layer and the first polysilicon silicon layer while leaving the oxide layer as said field insulating means on the silicon substrate.

2. A method of fabricating a semiconductor device which comprises the steps of:

forming a first oxide layer on a top surface of a silicon substrate;

forming a first polysilicon layer on a top surface of said first oxide layer;

forming a second oxide layer on a top surface of said first polysilicon layer;

forming a silicon nitride layer on a top surface of the second oxide layer;

removing a selected portion of the silicon nitride layer and the second oxide layer so as to form an aperture, said aperture reaching said first polysilicon layer;

forming one of a silicon layer and a second polysilicon layer on an exposed portion of the first polysilicon layer so as to close the aperture;

selectively oxidizing said one of a silicon layer and a second polysilicon layer and a portion of the first polysilicon layer defined beneath said one of a silicon layer and a second polysilicon layer to form a third oxide layer as a field insulating means while said silicon nitride layer serves as a mask;

removing the silicon nitride layer;

subjecting a portion of the first polysilicon layer which is left unoxidized to oxygen so as to form a fourth oxide layer; and removing the first, second and fourth oxide layers while leaving the third oxide layer as a field insulating means on the silicon substrate.

3. A method of fabricating a semiconductor device which comprises the steps of:

forming a first oxide layer on a top surface of a silicon substrate;

forming a first polysilicon layer on a top surface of said first oxide layer;

forming a second oxide layer on a top surface of said first polysilicon layer;

forming a silicon nitride layer on a top surface of said second oxide layer;

removing a selected portion of the silicon nitride layer and the second oxide layer so as to form an aperture, said aperture reaching said first polysilicon layer;

implanting an impurity ion into a portion of the silicon substrate below the aperture so as to prevent inversion;

forming one of a silicon layer and a second polysilicon layer on an exposed portion of the first polysilicon layer so as to close the aperture;

selectively oxidizing said one of a silicon layer and a second polysilicon layer and a portion of the first polysilicon layer defined beneath said one of a silicon layer and a second polysilicon layer to form an oxide layer as a field insulating means while said silicon nitride layer serves as a mask, and activating the impurity ion to form a layer for preventing inversion; and removing the silicon nitride layer and the first silicon layer while leaving the oxide layer as said field insulating means on the silicon substrate.

4. A method of fabricating a semiconductor device which comprises the steps of:

forming a first oxide layer on a top surface of a silicon substrate;

forming a first polysilicon layer on a top surface of said first oxide layer;

forming a second oxide layer on a top surface of said first polysilicon layer;

forming a silicon nitride layer on a top surface of said second oxide layer;

removing a selected portion of the silicon nitride layer and said second oxide layer so as to form an aperture, said aperture reaching said first polysilicon layer;

implanting an impurity ion into a portion of the silicon substrate below the aperture so as to prevent inversion;

forming one of a silicon layer and a second polysilicon layer on an exposed portion of the first polysilicon layer so as to close the aperture;

selectively oxidizing said one of a silicon layer and a second polysilicon layer and a portion of the first polysilicon layer defined beneath said one of a silicon layer and a second polysilicon layer to form a third oxide layer as a field insulating means while said silicon nitride layer serves as a mask, and activating the impurity ion to form a layer for preventing inversion;

removing the silicon nitride layer;

subjecting a portion of the first polysilicon layer which is left unoxidized to oxygen so as to form a fourth oxide layer; and removing the first, second and fourth oxide layer while leaving the third oxide layer as said field insulating means on the silicon substrate.

* * * * *